United States Patent
Kishida et al.

(10) Patent No.: US 6,200,384 B1
(45) Date of Patent: Mar. 13, 2001

(54) METHOD FOR PRODUCTION OF SILICON SINGLE CRYSTAL

(75) Inventors: Yutaka Kishida; Wataru Ohashi; Teruyuki Tamaki; Seiki Takebayashi, all of Kanagawa (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/361,245

(22) Filed: Jul. 27, 1999

(30) Foreign Application Priority Data

Jul. 27, 1998 (JP) .................................... 10-211228

(51) Int. Cl.⁷ .................................................. C30B 15/22
(52) U.S. Cl. .............................. 117/30; 117/32; 117/917
(58) Field of Search ................... 117/13, 30, 32, 117/917

(56) References Cited

U.S. PATENT DOCUMENTS

| | | | |
|---|---|---|---|
| 4,637,854 | * 1/1987 | Fukuda et al. | 117/30 |
| 5,178,720 | 1/1993 | Frederick | 156/618.1 |
| 5,766,346 | * 6/1998 | Hayashi et al. | 117/208 |
| 5,840,116 | * 11/1998 | Kubo | 117/20 |

FOREIGN PATENT DOCUMENTS

| | | |
|---|---|---|
| 1-282185 | 11/1989 | (JP) . |
| 2-12920 | 3/1990 | (JP) . |
| 8-18898 | 2/1996 | (JP) . |
| 8-259379 | 10/1996 | (JP) . |
| 8-259381 | 10/1996 | (JP) . |
| 2706165 | 10/1997 | (JP) . |
| 89/08731 | 9/1989 | (WO) . |

* cited by examiner

Primary Examiner—Felisa Hiteshew
(74) Attorney, Agent, or Firm—Wenderoth, Lind & Ponack, L.L.P.

(57) ABSTRACT

In the growth of a large silicon single crystal weighing not less than 100 kg by the Czokralski method resorting to application of a magnetic field, a crucible, not less than 0.7 m in inside diameter is used, and a cusped magnetic field which manifests a maximum intensity of not more than 1000 gausses on the inner wall of the crucible is applied.

5 Claims, 2 Drawing Sheets

METHOD FOR PRODUCTION OF SILICON SINGLE CRYSTAL

BACKGROUND OF THE INVENTION

1. Field of the Invention

This invention relates to a method for the production of a silicon single crystal of a large diameter and a great weight by Czochralski method, and more particularly to a technique which especially, controls the element which dissolves into the melt from the crucible and impurity which becomes entrapped to inside of the crystal, while the stabilization of the melt flow is attempted.

2. Description of the Related Art

Recently, a demand of the silicon wafer in which the caliber is bigger in response to area expansion of semiconductor device heightens. The crystal weight with the necessity exceeds 150 kg in the crystal for the wafer of the 200 mm size, and exceeds 500 kg in the crystal for the wafer of 300 mm size. The production technique of such crystal is inevitably limited to Czochralski method, and the scale-up of the process will be done using a crucible of an unprecedented large size.

However, the convection of silicon melt which is generated in crucible of the Czochralski method is stronger, as crucible diameter and melt depth are increased, and again, the method is accompanied by large turbulence. The turbulence of the melt convection exerts advance effects on the growth of crystal for the following three reasons.

Firstly, the disturbance of the convection brings an irregular temperature fluctuation along the course of time on the growth face of crystal and, at the same time, disrupts the axial symmetry of the melt temperature distribution. As a result, the thermal balance on the crystal growth interface is disturbed and the crystal growth as a single crystal is inhibited.

Secondly, the fortification of the convection promotes the transport of impurities from the bottom of a deteriorated quartz crucible and the impurities, on contacting the crystal in growth, make the crystal polycrystalline.

Thirdly, the disturbance of the convection gives rise to uneven concentrations of oxygen and dopant in the silicon melt. Even when a crystal free from dislocation is successfully grown, this disturbance causes wafers sliced off from the crystal to suffer from uneven quality in terms of oxygen concentration and magnitude of resistance.

As a way of curbing the adverse effects of the convection of the melt in the crucible of the Czochralski method, JP-B-02-12920 proposes a method for repressing the flow of the silicon melt by applying a static magnetic field of the cups to the melt. This method is claimed to impart an improved shape to the crystal by repressing the disturbance of the convection by virtue of the Lorentz force and prevent the crystal from pollution with the impurities transported from the crucible by repressing the thermal convection occurring in the radial direction. This publication barely cites a working example purporting manifestation of the effect thereof in repressing the amount of lattice defects in a GaAs crystal.

JP-A-01-282,185 and JP-B-08-18,898 show that even in a silicon single crystal, the application of a cusped magnetic field controls the oxygen concentration in the crystal by repressing the melt convection.

It has been meanwhile demonstrated that the repression of the convection in the silicon melt by the application of a static magnetic field results in impairing the homogenization effect of crystal quality by the crystal rotation. Japanese Patent No. 2,706,165 proposes a contrivance for repressing the strength of the vertical component of the magnetic field directly under a crystal.

It is not safe to conclude that the mechanism for repressing the convection by the application of a cusped magnetic field operates in entirely the same manner on silicon melt of a large amount exceeding some hundreds of kg. This assertion is based on the following reasons.

Firstly, the amount of silicon melt in the crucible used in working examples cited in JP-B-08-18,898, Japanese Patent No. 2,706,165, and JP-01-282,185 fall short of 1 kg in the first two cases and 34 kg in the last case. These amounts are smaller by not less than one decimal position than that of melt used in manufacturing the crystal for 200 mm or 300 mm size wafer.

Secondly, the extents of the effect of applying the magnetic field have not been clearly quantified, when changing the magnetic field strength and the container size, and varying the physical constants of raw material melt such as viscosity, coefficient of cubic expansion, electric conductivity, and density.

Thirdly, it has been discovered by the actual experiment on the temperature measurement of silicon melt produced by the Czokralski method that in a large crucible, the axial symmetry of the convection in the crucible is drastically disturbed to the extent of entailing the state of baroclinic wave (Kishida et al.: J. Crystal Growth (1992) and Watanabe et al.: J. Crystal Growth (1993)), the state of geostrophic turbulence (JP-A-09-255,790), and the state of hard turbulence and soft turbulence (Togawa et al.: J. Crystal Growth (1996), and JP-A-08-259,379). As a result, the form of the flow of the silicon melt itself to be controlled is completely different from those which are illustrated in the technics of applying the cusped magnetic field mentioned above.

SUMMARY OF THE INVENTION

This invention, initiated for the purpose of solving the problem incurred in the production of a silicon single crystal of a large size surpassing 100 kg, aims at providing a method for stabilizing the flow of silicon melt and allowing production of a large silicon single crystal free from uneven quality with a high productivity rate.

To accomplish the object mentioned above, this invention provides a method for the production of a silicon single crystal based on the Czokralski process comprising the steps of heating and fusing the raw material contained in a crucible in order to prepare a silicon melt, once immersing a seed crystal formed of a silicon single crystal in the silicon melt and then pulling the seed crystal up from the silicon melt, thus inducing growth of a silicon single crystal in succession to the trailing end of the seed crystal, which method is characterized by using the crucible with an inside diameter of not less than 0.7 m and performing the growth of the silicon single crystal while applying a cusped magnetic field whose maximum strength on the inner wall of the crucible is not more than 1000 gausses.

Further, for the purpose of stabilizing the flow in the silicon melt, it is commendable to rotate the crucible so as to satisfy the following formula (1) or (2).

$$W \geq 0.8 \times \exp(-B/1000) \times D^{-7/2} \quad (1)$$

$$W \leq 4.5 \times \exp(-B/1000) \times d^{9/4} \times \Delta T^{3/4} \times D^{-2} \quad (2)$$

wherein, W represents the number of revolutions of the crucible per minute (rpm), B the maximum strength of magnetic field (gauss) on the inner wall of the crucible, D the inside diameter (m) of the crucible to be used, d the largest depth of the silicon melt in the crucible, and ΔT the differece (°C.) between the temperature at the center of the bottom of the crucible and the temperature at the center of the surface of the silicon melt.

This invention, in the production of a silicon single crystal of such a large size as surpasses 100 kg, prevents the flow of silicon melt from being disturbed by a magnetic field and allows production of a large single crystal free from uneven quality with a high productivity rate.

Particularly, this invention limits the effect of a magnetic field exclusively to the boundary face of the crucible instead of repressing the flow throughout the entire volume of the silicon melt and, therefore, obviates the necessity for using a device capable of generating a strong magnetic field and permits a decrease in the cost of equipment.

The objects, features, and advantages of the present invention other than those mentioned above will become clear from the following description of the preferred embodiments.

DESCRIPTION OF THE PREFERRED EMBODIMENT

Figure 1:
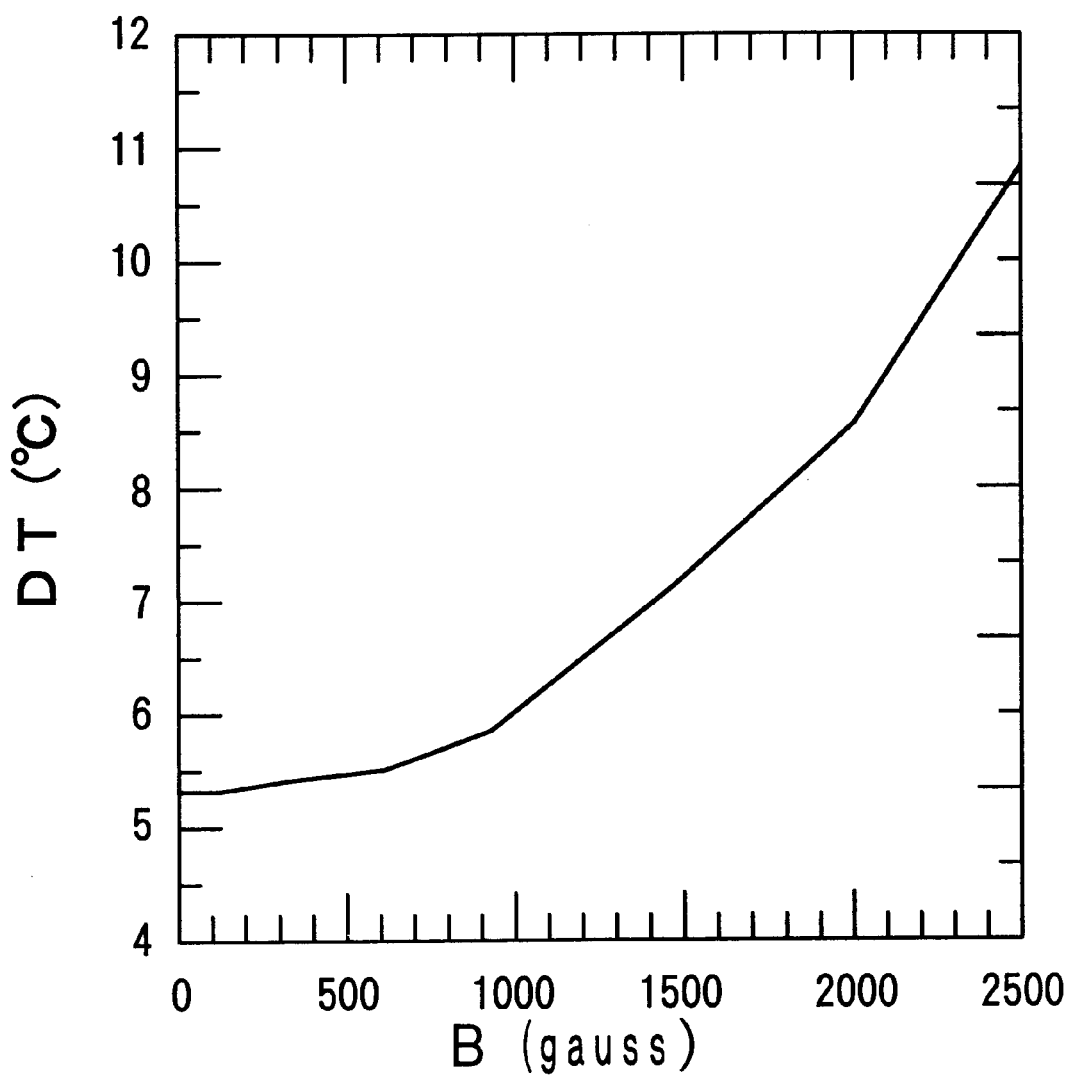
FIG. 1 is a graph showing the relation between the maximum intensity, B (gauss), of an applied cusped magnetic field on the inner wall of a crucible and the root mean square of temperature fluctuation, DT (°C.), at the central position of the surface of a silicon melt.

Now, this invention will be described in detail below by reference to preferred embodiments.

The method of production according to this invention, in the growth of a silicon single crystal by the method popularly called the Czokralski (CZ) method which attains the growth by pulling a single crystal from the melt of raw material, uses a crucible with a large inside diameter of not less than 0.7 m and applies a cusped magnetic field whose maximum strength, B, on the inner wall of the crucible to is not more than 1000 gausses.

In the large crucible, not less than 0.7 m in inside diameter, which will be used for effecting the present invention, the silicon melt has extremely high instability in the absence of a magnetic field and enjoys fully satisfactory stirring and is divided into two regions, i.e. a thin boundary layer region held in contact with the inner wall of the crucible and a bulk region excluding it. In the former boundary layer region, the flow of silicon is immobilized on the outermost surface of the crucible and the disturbance of the bulk region is attenuated as though in concert with the immobilization. The transport of oxygen and impurities from the inner wall surface of the crucible is diffused in the rate-determining manner in the boundary layer region. The transport is repressed in proportion as the boundary layer gains in thickness. In the latter bulk regions, the flow is evenly disturbed and the temperature in the melt and the concentrations of oxygen and dopant are homogenized.

Incidentally, when the crucible has an inside diameter of not less than 0.7 m, the flow of silicon melt in the crucible assumes the state mentioned above. Thus, the crucible does not need to impose any upper limit particularly to the inside diameter, D. From the viewpoints of the design of a device for pulling the single crystal, etc., however, the inside diameter, D, of the crucible falling in the approximate range of not less than 0.7 m and not more than 2.0 m may be typically adopted.

The cusped magnetic field which is a magnetic field to be applied during the growth of a silicon single crystal by the method of production according to this invention has the radial line of magnetic force configuration that it is axisymmetric for the crucible rotating shaft and that the strength becomes a minimum near the crystal growth interface. Then, the magnetic field distribution that magnetic field strength as away from the crystal growth interface increases and that it becomes a maximum on the inner wall of the crucible is constituted in the melt. This magnetic field distribution can be formed by disposing coils which run ring currents in the opposite directions to each other, at the upper and lower position of the crucible so they face each other, in a device for pulling a single crystal as disposed in JPB-02-12,920, for example. This invention, however, does not need to discriminate particularly the layout and construction of magnets to be used, so long as the cusped magnetic field can be formed as required.

In the boundary layer region of the melt in the crucible, the boundary layer gains in thickness because the application of a magnetic field gives birth to Lorentz force and causes the flow to be more restricted by the boundary of the crucible. Owing to this fact, it is possible to suppress the dissolution contamination of the oxygen from crucible to the melt, and to suppress movement of the impurity to the bulk region. Since the Lorentz force about enough to equal the viscous force exerted on the melt suffices for the restriction mentioned above, the applied magnetic field having an intensity of some hundreds of gausses is fully effective.

It is known meanwhile that when a static magnetic field is applied to the flow of a conductive fluid homogenized by turbulence, this flow becomes a chaotic state and suffers disruption of homogeneity (Libehaber et al.: Physica 7D (1983)). In a large crucible, the repression of the convection by a magnetic field as proposed in JP-B-02-12,920 and Japanese Patent No. 2,706,165 amounts to nothing but to destroy the bulk region homogenized by turbulence.

The relation between the temperature fluctuation width of the melt surface and the intensity of a magnetic field, determined in a large crucible 0.7 m in inside diameter in accordance with the method of JP-A-08-259,381 is shown in FIG. 1. Specifically, FIG. 1 illustrates the relation between the maximum strength, B (gauss), of an applied cusped magnetic field on the inner wall of a crucible and the root mean square of the temperature fluctuation, DT (°C.), at the central position of the melt surface. Here, the temperature fluctuation of the melt surface is found from a change over a period of 10 minutes under the temperature condition in the seed crystal dipping by the technique according to JP-A-08-259,381.

The content of the disclosure of JP-A-08-259,381, in summary, concerns a method which comprises observing the two-dimensional distribution of radiation energy emitted from the melt surface with a two-dimensional imaging device, such as a CCD camera, located at the upper part of the melt, converting the produced image into an electric signal, converting this electric signal into data of temperature thereby obtaining a two-dimensional temperature distribution on the surface of the silicon melt, and measuring the change of the distribution along the course of time. The method enables the optimum environment for the growth of crystal to be expeditiously and infallibly obtained by adjusting the operating condition based on the two-dimensional temperature distribution on the melt surface and the change thereof along the course of time which have been acquired as described above. The content of JP-A08-259,381 is incorporated herein by reason of association.

It is clearly noted from FIG. 1 that the temperature fluctuation of the melt abruptly increases when the maximum intensity of the magnetic field surpasses 1000 gausses. That is, the application of an excessive static magnetic field surpassing 1000 gausses makes the melt flow unstable, and the heterogeneity of temperature and oxygen concentration in the melt will grow worse, and a good effect for the crystal growth is not achieved. In the bulk region which forms turbulence in the large crucible, therefore, it is essential to lower the magnetic field strength so as to repress the influence of the magnetic field to the fullest possible extent.

To allow the restraining force of the magnetic field to act exclusively on the boundary face of the melt held in contact with the inner wall of the crucible and avoid repressing the melt flow on other than the boundary face, the cusped magnetic field applied in this invention would not be allowed to have a maximum intensity exceeding 1000 gausses on the inner wall of the crucible.

The maximum strength of the magnetic field on the inner wall of the crucible may be quite small so long as the restraining force can be exerted on the boundary face of the melt held in contact with the inner wall of the crucible as mentioned above. When the maximum intensity of the magnetic field on the inner wall of the crucible is so small as to fall short of 20 gausses, for example, the effect of the application of the magnetic field in controlling the flow of the silicon melt substantially ceases to exist, with the possible result that the produced single crystal will not be expected to acquire improved quality and productivity. It is particularly preferable to set the maximum intensity of the cusped magnetic field on the inner wall of the crucible typically in the approximate range of 20–500 gausses.

Further, since the applied magnetic field strength is weak, the disturbance of the melt flow can be more homogenized by setting the revolution number of the crucible so as to allow occurrence of geostrophic turbulence in the melt. By utilizing this characteristic of the flow, the probability of the silicon melt to be grown in a single crystal and the homogenization of the quality of crystal can be exalted. To induce the geostrophic turbulence in the silicon melt held in the crucible, the relation between the inside diameter, D (m), of the crucible to be used, the revolution number, W (rpm), of the crucible per minute, and the maximum strength, B (gauss), of the magnetic field on the inner wall of the crucible is to be set so as to satisfy the formula.

$$\leq 0.8 \times \exp(-B/1000) \times D^{-7/2} \quad (1)$$

Then, the probability of the melt to be grown in a single crystal and the homogenization of the quality of crystal can be further exalted by repressing the depth, d (m), of the melt and devising a method for insulating or heating the interior of the furnace thereby decreasing the difference, θT (°C.), of temperature between the surface of the silicon melt and the bottom part of the crucible along the central axis of the crucible and satisfying the relation represented by the following formula.

$$W \leq 4.5 \times \exp(-B/1000) \times d^{9/4} \times \theta T^{3/4} \times D^{-2} \quad (2)$$

For the sake of reference, typical relations between the minimum revolution number of the crucible and the maximum strength of the magnetic field on the inner wall of the crucible, which are necessary for embodying preferred modes of satisfying the aforementioned relations of (1) and (2) (in the case of θT=50° C. and d=0.25m) in crucibles of varying sizes are shown in Table 1.

TABLE 1

| Inner diameter of crucible (inch) | Inner diameter of crucible (m) | Maximum magnetic field strength on the inner wall of crucible (gauss) | Minimum revolution number of crucible (rpm) according to the relational expression (1) | Minimum revolution number of crucible (rpm) according to the relational expression (2) at ΔT = 50° C., d = 0.25 m |
|---|---|---|---|---|
| 28' | 0.70 | 100 | 2.52 | 6.91 |
| 32' | 0.80 | 100 | 1.58 | 5.29 |
| 36' | 0.90 | 100 | 1.05 | 4.18 |
| 40' | 1.00 | 100 | 0.72 | 3.38 |
| 48' | 1.20 | 100 | 0.38 | 2.35 |
| 28' | 0.70 | 300 | 2.07 | 5.65 |
| 32' | 0.80 | 300 | 1.29 | 4.33 |
| 36' | 0.90 | 300 | 0.86 | 3.42 |
| 40' | 1.00 | 300 | 0.59 | 2.77 |
| 48' | 1.20 | 300 | 0.31 | 1.92 |
| 28' | 0.70 | 600 | 1.53 | 4.19 |
| 32' | 0.80 | 600 | 0.96 | 3.21 |
| 36' | 0.90 | 600 | 0.63 | 2.53 |
| 40' | 1.00 | 600 | 0.44 | 2.05 |
| 48' | 1.20 | 600 | 0.23 | 1.43 |

In short, this invention contemplates restricting the effect of the static magnetic field in the Czokralski method resorting to the application of a magnetic field exclusively to the function of increasing the thickness of the boundary layer, and controlling the flow in the bulk region by the turbulence occurring in a large crucible, preferably the geostrophic turbulence which is induced by increasing the revolution number of the crucible.

Figure 2:
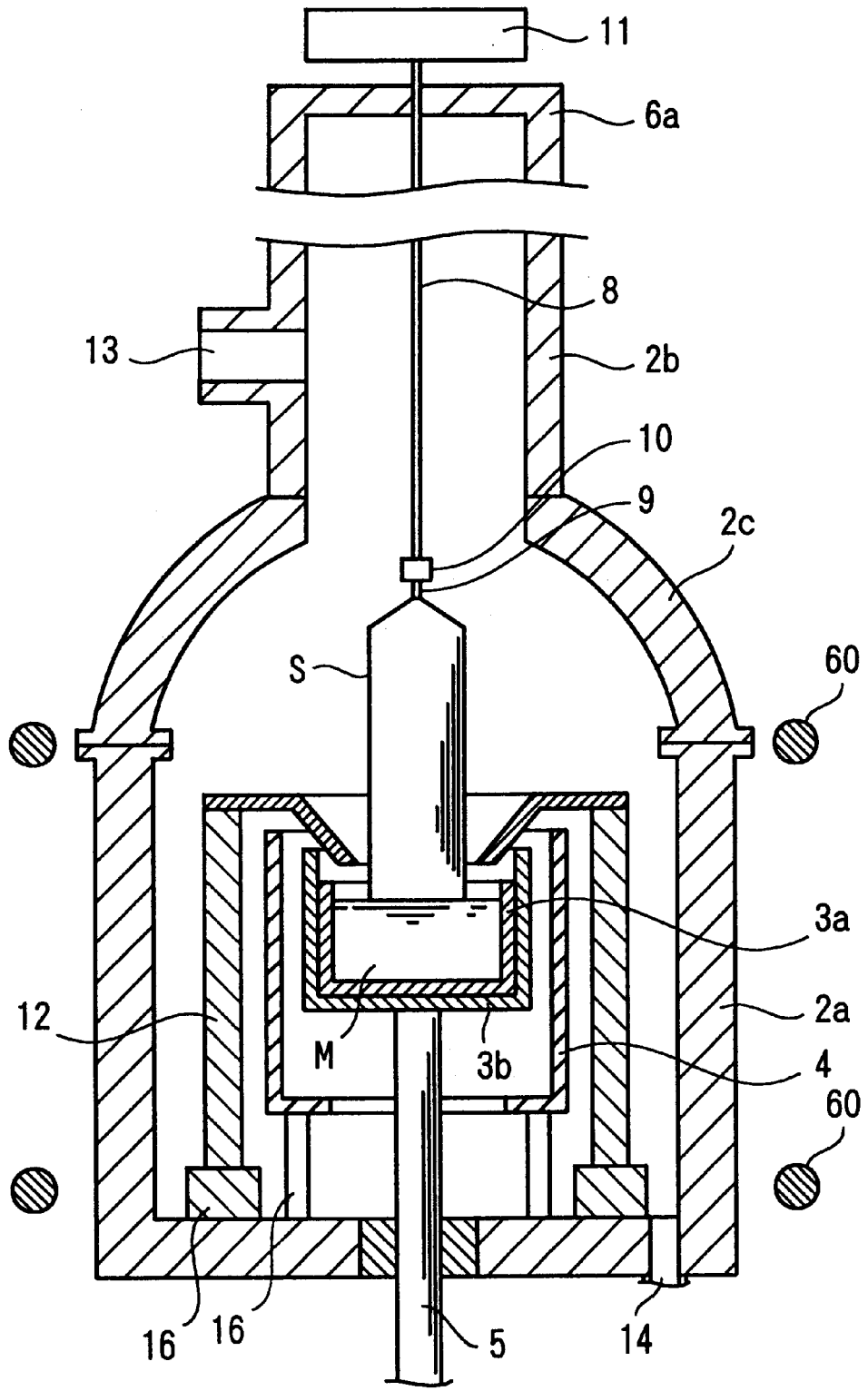
FIG. 2 is a partial sectional view illustrating typically the construction of one embodiment of an apparatus for the production of a silicon single crystal to be used in the method for the production of a silicon single crystal according to this invention.

FIG. 2 illustrates one embodiment of an apparatus for the production of a silicon single crystal to be used in the method according to this invention. The construction of the apparatus for production and the process of production of a silicon single crystal by the use of the apparatus as illustrated herein are intended to facilitate comprehension of this invention. As is easily understood by any person of ordinary skill in the art, this invention is not limited at all to the aspect of the embodiment illustrated herein below, and it would be possible to make many modifications and changes to such embodiment within the scope of this invention.

An apparatus for the production of a silicon single crystal, as illustrated in FIG. 2, is provided with members for melting silicon, mechanisms for pulling silicon crystal, etc. The members for melting silicon are contained in a heating chamber 2a and the mechanisms for pulling the silicon crystal are disposed inside and outside a pulling chamber 2b. An intermediate chamber 2c is interposed between the heating chamber 2a and the pulling chamber 2b.

A crucible 3 for accommodating silicon melt M is provided inside the heating chamber 2a. This crucible 3 is supported through the medium of a rotary shaft 5 on a drive device (not shown) so as to be rotated and elevated freely.

The drive device elevates the crucible 3 so much as to compensate a fall of the liquid level due to a pull of the silicon single crystal S and rotates the crucible 3 at a stated revolution number so as to stir the silicon melt M.

The rotary shaft pierces the heating chamber 2a. This rotary shaft, to provide an airtight barrier for the chamber 2 and fulfill the service even under extremely inferior temperature conditions, is retained by a special bearing (not shown).

The crucible 3 is composed of a quartz crucible 3a and a graphite crucible 3b adapted to protect the quartz crucible 3a, as shown in the conventional apparatus.

Around the lateral surface of the crucible 3, a heater 4 for melting silicon is disposed so as to encompass the periphery of the crucible 3.

On the outer side of the heater 4, an insulating material 12 for preventing the heat from the heater to irradiate the heating chamber 2a directly is disposed so as to encircle the periphery of the heater.

The heater 4 and the insulating material 12 are attached to a supporting base 16. This supporting base 16 is made of a material having very high thermal resistivity.

The pulling chamber 2b is provided with a pulling wire 8 which is fastened at one end thereof to a wiring hoisting device 11, and another suspended end of which is passed through the top wall of a ceiling part 6a of the pulling chamber 2b, and reaches into the space within the heating chamber 2a. To the lower end of this pulling wire 8 is fastened a chuck 10 for retaining a seed crystal 9.

The wire hoisting device 11 pulls the silicon single crystal S gradually growing under the lower end side of the seed crystal 9 proportionately to the speed of growth thereof and, at the same time, rotates constantly in the direction opposite the rotation direction of the crucible 3.

Argon gas is introduced through a gas inlet 13 formed in the containing part of the pulling chamber 2b. The argon gas, after flowing through the interior of the heating chamber 2a, is discharged through a waste gas outlet 14.

The passage of the argon gas effected as described above through the interior of the chamber 2 is intended, as described above, to protect the silicon melt against possible invasion by the SiO gas and the CO gas which are generated in the chamber 2 in consequence of the fusion of silicon by the heater 4.

In addition, in the outside of the heating chamber 2a, a magnetic field applying device 60 is settled so as to be possible to apply the cusped magnetic field to the melt, which device 60 is composed of coils which are disposed so as to encircle the heating chamber 2a in the upper and the lower position relative to the crucible 3 disposed in the chamber, and which run ring currents in opposite directions to each other The manufacture of a silicon single crystal according to this invention may be performed on the basis of the CZ method using the apparatus of production just described. The pulling up operation itself, as universally known, comprises heating and melting raw materials such as polycrystalline silicon and optionally added dopant which are contained in the crucible 3, thus preparing silicon melt M, once immersing a seed crystal 9 formed of a silicon single crystal in the melt and then pulling the seed crystal up from the silicon melt, thus inducing growth of a silicon single crystal in succession to the trailing end of the seed crystal. The silicon single crystal to be grown, immediately after start of the growth, is temporarily constricted so as to eliminate dislocation, then allowed to expand to a required diameter by gradually lowering the speed of pulling and/or the temperature of the silicon melt, and thereafter allowed to continue growth in a required diameter until a required weight or required length. In this invention, it is not always necessary to apply the cusped magnetic field over the whole period from the time the silicon melt is prepared to the time the growth of a single crystal is completed, since the application of the magnetic field is done for the quality control of the part useful for product. Thus, it may be done during the period in which the single crystal is pulled up in a desired diameter. Further, it may be done in a specific portion of the period in which the single crystal is pulled up in a required diameter, for example, the latter half of the period.

It may be easily understood by any person of ordinary skill in the art that for the purpose of adjusting as required the conditions of cooling the crystal at the time that the crystal is pulled, various cooling devices, insulating devices, and heating devices heretofore known to the art, and the various known applied techniques to the CZ method, such as the technique for controlling the diameter, the technique for controlling the temperature distribution, the technique for controlling the flow of silicon melt, and the technique for controlling the atmosphere are applicable without departure from the scope and spirit of this invention.

The method of production according to this invention does not need to discriminate particularly the conditions other than the diameter of crucible and the applied magnetic field, such as, for example, the speed of pulling the single crystal, the revolution numbers of single crystal and crucible, the atmospheric gas and pressure.

Now, this invention will be described more specifically below by illustrating concrete working examples of this invention. The working examples cited blow are intended solely to ensure clear comprehension of the content of this invention. The invention is not limited in any respect to the examples so cited.

EXAMPLES

In crucibles, 0.61 m (24 inches) and 0.71 m (28 inches) in inside diameter, raw material silicon was melted to produce silicon melt in respective depths of 280 mm and 300 mm. The silicon melts were subjected to trial growth of silicon single crystal under conditions having the revolution number of crucible and the maximum strength of the applied cusped magnetic field on the inner wall of crucible varied. Under the various test conditions, the crystals in growth were tested for the root mean square of the temperature fluctuation at the central position of the silicon melt surface during 10 minutes immediately preceding the immersion of seed crystal according to the method disclosed in JP-A-08-25,938 (as mentioned above); the probability of a crystal 320 mm in diameter, to be grown as a single crystal; the oxygen concentration at the central point of a wafer sliced off from the upper end of the constant diameter part of crystal grown as a single crystal, and the oxygen concentration at the central point of a wafer sliced off from a position 800 mm below in the direction of crystal growth from the upper end of the constant diameter part. The results of test are shown collectively in Table 2. In Control 1, since a crystal having the constant diameter part length exceeding 600 mm could not be grown on account of the limit on the crucible capacity, the difference of oxygen concentration in the direction of crystal growth was rated with the values of oxygen concentration at a position 600 mm below from the upper end of the constant diameter part.

The probability of the growth as a single crystal was obtained by performing the relevant test up to 10 repetitions. The concentration of oxygen in a wafer was obtained by slicing a sample off from a grown single crystal, polishing the sample to specular surface, and measuring the oxygen concentration by the Fourier transformation type infrared absorption method (FT-IR method), and calculating the concentration based on the oxygen concentration conversion coefficient established by Japan Electronic Industry Development Association.

In Example 1, a crucible, 0.71 m (28 inches) in inside diameter was used, the maximum of magnetic field on the inner wall of crucible set at 100 gausses, and the revolution number of crucible at 1 rpm. This example satisfied the diameter of crucible and the condition of applied magnetic field according to this invention. It failed to satisfy the relational expressions (1) and (2) as more preferable conditions of this invention to induce a geostrophic turbulent because the revolution number of crucible was as low as 1 rpm. While the temperature fluctuation on the surface of silicon melt, therefore, was rather large, the probability of a crystal to be grown as a single crystal was 70%, a relatively high magnitude. In the crystal grown in this case, the difference of oxygen concentration at the upper end of the constant diameter part and at the position 800 mm thereunder was 2.4 E 17 atoms/cm$^3$. The variation in the direction of crystal growth was favorably small.

Example 2 is a case of adding 3 rpm to the revolution number of crucible in the conditions involved in Example 1. Thus, it satisfied the conditions for inducing the geostrophic turbulence described in the relational expression (2). In this case, the probability of crystal to be grown as a single crystal was as high as 90% and the difference of oxygen concen-

TABLE 2

|  | Ctrl. 1 | Ex. 1 | Ex. 2 | Ctrl. 2 | Ex. 3 | Ex. 4 | Ex. 5 | Ex. 6 | Ctrl. 3 |
| --- | --- | --- | --- | --- | --- | --- | --- | --- | --- |
| Inner diameter of crucible (m) | 0.61 | 0.71 | 0.71 | 0.71 | 0.71 | 0.71 | 0.71 | 0.71 | 0.71 |
| Depth of melt (mm) | 280 | 300 | 300 | 300 | 300 | 300 | 300 | 300 | 300 |
| Weight of melt (kg) | 160 | 230 | 230 | 230 | 230 | 230 | 230 | 230 | 230 |
| Revolution number of crucible (rpm) | 3 | 1 | 3 | 6 | 6 | 6 | 6 | 6 | 6 |
| Maximum magnetic field strength on the inner wall of crucible (gauss) | 300 | 100 | 100 | 0 | 100 | 300 | 600 | 900 | 1500 |
| Temperature fluctuation at the center location of melt surface (° C. standard deviation) | 7.4 | 6.0 | 5.8 | 5.3 | 5.3 | 5.4 | 5.5 | 5.8 | 7.2 |
| Probability of being grown as a single crystal (%) | 20 | 70 | 75 | 90 | 90 | 90 | 80 | 70 | 0 |
| Oxygen concentration at the upper end of constant diameter part of grown crystal (× E17 atoms/cm$^3$) | 11.2 | 8.4 | 8.9 | 11.5 | 9.0 | 8.1 | 7.7 | 7.5 | — |
| Oxygen concentration at the 800 mm downward position from the upper end of constant diameter part of grown crystal (× E17 atoms/cm$^3$) | (7.8)* | 7.0 | 6.7 | 7.3 | 6.8 | 6.9 | 6.9 | 6.9 | — |
| Difference in the oxygen concentration between the upper end and the 800 mm downward position (× E17 atoms/cm$^3$) | (4.4)* | 2.4 | 2.2 | 4.2 | 1.2 | 1.2 | 0.8 | 0.6 | — |
| Satisfaction of the condition for applied cusped magnetic field | No | Yes | Yes | No | Yes | Yes | Yes | Yes | No |
| Satisfaction of the condition for geostrophic turbulent flow of the relational expression (1) | No | No | Yes | Yes | Yes | Yes | Yes | Yes | No |
| Satisfaction of the condition for geostrophic turbulent flow of the relational expression (2) | No | No | No | Yes | Yes | Yes | Yes | Yes | No |

*Evaluated at the 600 mm downward position

Control 1 represents the case of applying to a crucible, 0.61 m (24 inches) in inside diameter, a magnetic field manifesting a maximum of 300 gausses on the inner wall of the crucible. The crucible used herein does not satisfy the condition of the diameter of crucible contemplated by the present invention. As a result, the bulk region was not sufficiently homogenized and the application of the magnetic field impaired the stable state of silicon melt. Thus, the temperature on the surface of the silicon melt was widely varied and the probability of a crystal to be grown as a single crystal was as low as 20%.

tration in the direction of length of crystal was 2.2 E 17 atoms/cm$^3$, a commendable magnitude.

Control 2, Examples 3–6, and Control 3 each used a crucible, 0.71 m (28 inches) in inside diameter. They invariably devised to lower the difference of temperature between the bottom and the surface of a crucible below 20 C. by heightening the insulating capacity in a crucible by changing the insulating material in the crucible used in Examples 1 and 2. Since the maximum depth of silicon melt in the crucible was set at 300 mm and the revolution number of crucible at 6 rpm, these examples satisfied the conditions for inducing a geostrophic turbulent described in the formula (2).

In Control 2, although the probability of a crystal to grow as a single crystal was as high as 90%, the fusion of oxygen from the surface of the inner wall of the crucible was heavy, the oxygen concentration at the upper end of the typical part of crystal was as high as 11.5 E 17 atoms/cm$^3$, and the difference of oxygen concentration in the direction of length of crystal was as large as 4.2 E 17 atoms/cm$^3$ because the magnetic field strength was 0 gauss.

In Examples 3–6, the maximum strength of magnetic field were respectively 100, 300, 600, and 900 gausses. The temperature fluctuation on the surface of silicon melt widened in proportion as the intensity of magnetic field increased. The probability of crystal to grow as a single crystal was not less than 70%, a commendable magnitude, even in Example 6 involving the application of a magnetic field of 900 gausses. The oxygen concentration in crystal was conspicuously low as compared with Control 2.

In Control 3, though the maximum intensity of magnetic field was set at 1500 gausses, the crystal failed to grow as a single crystal because the application of the magnetic field resulted in impairing the stability of the temperature fluctuation on the surface of silicon melt.

The entire disclosure of Japanese Patent Application No. 10-211,228 filed on Jul. 27, 1998, including specification, claims, drawings and summary is incorporated herein by reference in its entirety.

What is claimed is:

1. A method for the production of a silicon single crystal based on the Czokralski process comprising heating and melting a raw material contained in a crucible in order to prepare a silicon melt, once immersing a seed crystal formed of a silicon single crystal in said silicon melt and then pulling said seed crystal up from said silicon melt, thus inducing growth of a silicon single crystal in succession to a trailing end of said seed crystal, wherein said crucible has an inside diameter of not less than 0.7 m and the growth of said silicon single crystal is performed while applying a cusped magnetic field whose largest intensity on an inner wall of said crucible is not more than 1000 gausses.

2. A method according to claim 1, wherein said silicon crystal is pulled by rotating said crucible under the condition satisfying the relation of the following expression, $$W \leq 0.8 \times \exp(-B/1000) \times D^{-7/2}$$

wherein W represents the revolution number of said crucible per minute (rpm), B the maximum strength of magnetic field (gauss) on the inner wall of said crucible, and D the inside diameter (m) of said crucible.

3. A method according to claim 1, wherein said silicon crystal is pulled by rotating said crucible under the condition satisfying the relation of the following expression, $$W \leq 4.5 \times \exp(-B/1000) \times D^{9/4} \times \theta T^{3/4} \times D^{-2}$$

wherein W represents the revolution number of said crucible per minute (rpm), B the maximum strength of magnetic field (gauss) on the inner wall of said crucible, d the maximum depth of silicon melt in the crucible, θT the difference (°C.) of temperature between the center of the bottom part of said crucible and the center of the melt surface, and D the inside diameter (m) of said crucible.

4. A method according to claim 1, wherein the maximum intensity of said magnetic field on the inner wall of said crucible is in the range of 20–500 gausses.

5. A method according to claim 1, wherein the inside diameter of said crucible is in the range of 0.7–2.0 m.

* * * * *